(12) United States Patent
Hsiao et al.

(10) Patent No.: US 9,558,955 B2
(45) Date of Patent: Jan. 31, 2017

(54) FORMATION METHOD OF SEMICONDUCTOR DEVICE THAT INCLUDES PERFORMING HYDROGEN-CONTAINING PLASMA TREATMENT ON METAL GATE STACK

(71) Applicant: TAIWAN SEMICONDUCTOR MANUFACTURING CO., LTD., Hsin-Chu (TW)

(72) Inventors: Ru-Shang Hsiao, Jhubei (TW); Chi-Cherng Jeng, Tainan (TW); Chih-Mu Huang, Tainan (TW); Shin-Yeu Tsai, Zhubei (TW); Fang-Wei Lin, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/795,299

(22) Filed: Jul. 9, 2015

(65) Prior Publication Data
US 2016/0225630 A1 Aug. 4, 2016

Related U.S. Application Data

(60) Provisional application No. 62/111,494, filed on Feb. 3, 2015.

(51) Int. Cl.
| | |
|---|---|
| *H01L 21/4763* | (2006.01) |
| *H01L 21/3065* | (2006.01) |
| *H01L 21/283* | (2006.01) |
| *H01L 21/308* | (2006.01) |
| *H01L 21/30* | (2006.01) |
| *H01L 21/8234* | (2006.01) |
| *H01L 29/66* | (2006.01) |

(52) U.S. Cl.
CPC ......... *H01L 21/3065* (2013.01); *H01L 21/283* (2013.01); *H01L 21/3003* (2013.01); *H01L 21/3081* (2013.01); *H01L 21/47635* (2013.01); *H01L 21/82345* (2013.01); *H01L 29/66545* (2013.01)

(58) Field of Classification Search
CPC .................................................. H01L 21/47635
See application file for complete search history.

(56) References Cited

U.S. PATENT DOCUMENTS

| | | | |
|---|---|---|---|
| 6,355,571 B1 * | 3/2002 | Huang | B08B 7/0035 257/E21.226 |
| 2006/0154481 A1 * | 7/2006 | Wu | H01L 21/3003 438/683 |
| 2015/0270142 A1 * | 9/2015 | Liu | H01L 21/321 257/369 |

* cited by examiner

*Primary Examiner* — Stephen W Smoot
(74) *Attorney, Agent, or Firm* — Birch, Stewart, Kolasch & Birch, LLP

(57) ABSTRACT

A method for forming a semiconductor device structure is provided. The method includes forming a metal gate stack over a semiconductor substrate. The method also includes performing a hydrogen-containing plasma treatment on the metal gate stack to modify a surface of the metal gate stack. The hydrogen-containing plasma treatment includes exciting a gas mixture including a first hydrogen-containing gas and a second hydrogen-containing gas to generate a hydrogen-containing plasma.

20 Claims, 6 Drawing Sheets

FORMATION METHOD OF SEMICONDUCTOR DEVICE THAT INCLUDES PERFORMING HYDROGEN-CONTAINING PLASMA TREATMENT ON METAL GATE STACK

PRIORITY CLAIM AND CROSS-REFERENCE

This application claims the benefit of U.S. Provisional Application No. 62/111,494, filed on Feb. 3, 2015, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (such as the smallest component (or line) that can be created using a fabrication process) has decreased. This scaling-down process generally provides benefits by increasing production efficiency and lowering associated costs.

However, since the feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
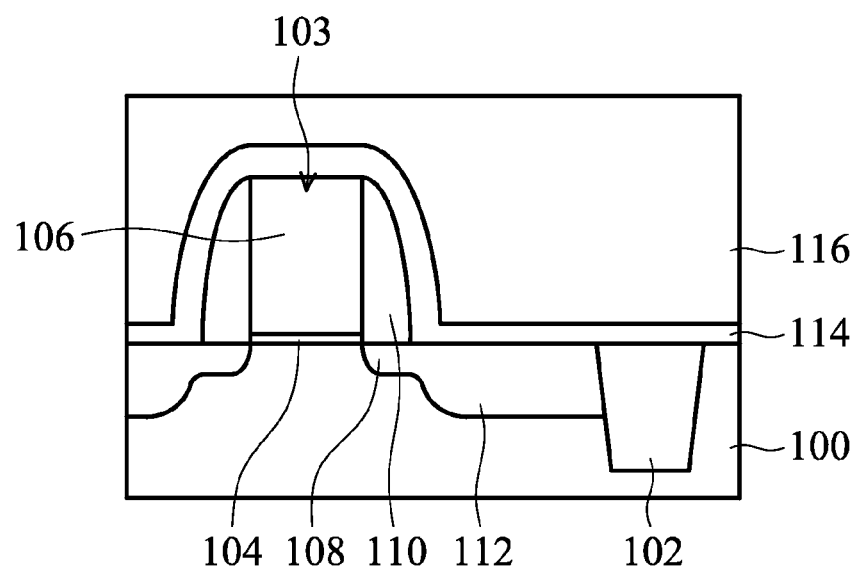
FIGS. 1A-1I are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1I are cross-sectional views of various stages of a process for forming a semiconductor device structure, in accordance with some embodiments. Additional operations can be provided before, during, and/or after the stages described in FIGS. 1A-1I. Some of the stages that are described can be replaced or eliminated for different embodiments. Additional features can be added in the semiconductor device structure. Some of the features described below can be replaced or eliminated for different embodiments.

As shown in FIG. 1A, a semiconductor substrate 100 is provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or other elementary semiconductor materials such as germanium. In some other embodiments, the semiconductor substrate 100 includes a compound semiconductor. The compound semiconductor may include gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof. In some embodiments, the semiconductor substrate 100 shown in FIG. 1A is a fin structure.

As shown in FIG. 1A, isolation features 102 are formed in the semiconductor substrate 100, in accordance with some embodiments. The isolation features 102 are used to define and/or electrically isolate various device elements formed in and/or over the semiconductor substrate 100. In some embodiments, the isolation features 102 includes shallow trench isolation (STI) features, local oxidation of silicon (LOCOS) features, another suitable isolation feature, or a combination thereof. In some embodiments, the isolation features 102 are made of a dielectric material. The dielectric material may include silicon oxide, silicon nitride, silicon oxynitride, fluoride-doped silicate glass (FSG), low-K dielectric material, another suitable material, or a combination thereof. In some embodiments, the semiconductor substrate 100 shown in FIG. 1A is a fin structure that protrudes from the tops of the isolation features 102.

As shown in FIG. 1A, a gate stack 103 is formed over the semiconductor substrate 100, in accordance with some embodiments. In some embodiments, the gate stack 103 includes a gate dielectric layer 104 and a gate electrode 106. In some embodiments, the gate stack 103 further includes a hard mask (not shown) formed on the gate electrode 106. The hard mask may serve as an etching mask during the formation of the gate electrode 106.

In some embodiments, the gate dielectric layer 104 is made of silicon oxide, silicon nitride, silicon oxynitride, dielectric material with high dielectric constant (high-K), another suitable dielectric material, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 104 is a dummy gate dielectric layer which will be removed in a subsequent gate replacement process. The dummy gate dielectric layer is, for example, a silicon oxide layer. Many variations and/or modifications can be made to embodiments of the disclosure. In some other embodiments, the gate dielectric layer 104 is not formed.

In some embodiments, the gate electrode 106 includes polysilicon, a metal material, another suitable conductive material, or a combination thereof. In some embodiments, the gate electrode 106 is a dummy gate electrode and will be replaced with another conductive material, such as a metal material. The dummy gate electrode layer is made of, for example, polysilicon.

In some embodiments, a gate dielectric material layer, a gate electrode layer, and a hard mask layer are deposited over the semiconductor substrate 100. Each of the gate dielectric material layer, the gate electrode layer, and the hard mask layer may be deposited using a chemical vapor deposition (CVD) process, an atomic layer deposition (ALD) process, a physical vapor deposition (PVD) process, another applicable process, or a combination thereof. Afterwards, a photolithography process and an etching process are performed to pattern the hard mask layer so as to form the hard mask. The gate dielectric material layer and the gate electrode layer are etched afterwards through openings defined by the hard mask. As a result, multiple gate stacks including the gate stack 103 are formed.

In some embodiments, spacer elements 110 are formed over sidewalls of the gate stack 103, as shown in FIG. 1A. The spacer elements 110 may be used to assist in subsequent processes such as an ion implantation process. The spacer elements 110 may be made of silicon nitride, silicon oxynitride, silicon carbide, silicon carbon nitride, another suitable material, or a combination thereof. In some embodiments, a spacer material layer is deposited over the semiconductor substrate 100 and the gate stack 103. Afterwards, an anisotropic etching process is performed to partially remove the spacer material layer. As a result, the remaining portions of the spacer material layer form the spacer elements 110.

As shown in FIG. 1A, doped regions 108 and 112 are formed in the semiconductor substrate 100, in accordance with some embodiments. In some embodiments, the doped region 108 is a lightly doped source and drain (LDS/D) region. The doped region 108 may be formed before the formation of the spacer elements 110. In some embodiments, the doped region 112 is a heavily doped source and drain (S/D) region. The doped region 112 may be formed after the formation of the spacer elements 110.

Afterwards, a contact etch stop layer 114 is deposited over the semiconductor substrate 100, the spacer elements 110, and the gate stack 103, as shown in FIG. 1A in accordance with some embodiments. In some embodiments, the contact etch stop layer 114 is made of a dielectric material. The dielectric material may include silicon nitride, silicon oxynitride, silicon carbide, silicon carbon nitride, another suitable material, or a combination thereof. Many variations and/or modifications can be made to embodiments of the disclosure. In some other embodiments, the contact etch stop layer 114 is not formed.

As shown in FIG. 1A, a dielectric layer 116 is deposited over the contact etch stop layer 114, in accordance with some embodiments. The dielectric layer 116 may be made of silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. The dielectric layer 116 may be deposited using a CVD process, an HDPCVD process, a spin-on process, a sputtering process, another applicable process, or a combination thereof.

Figure 1B:
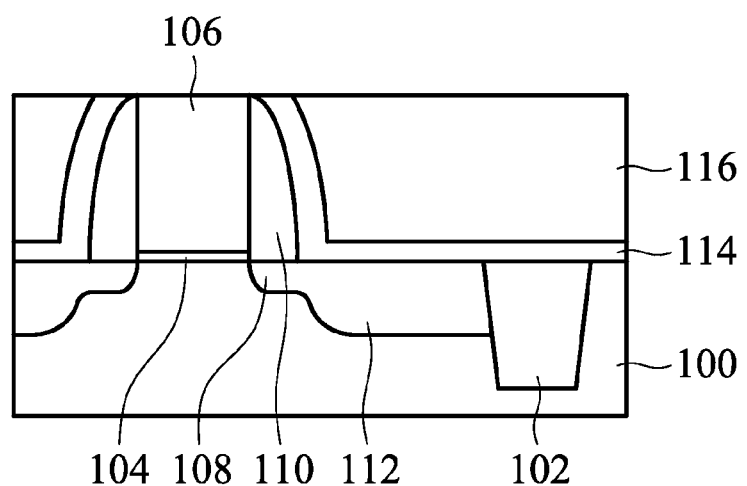

As shown in FIG. 1B, a planarization process is performed on the dielectric layer 116 to thin the dielectric layer 116 until the gate electrode 106 is exposed, in accordance with some embodiments. The planarization process may include a chemical mechanical polishing (CMP) process, a grinding process, an etching process, another applicable process, or a combination thereof.

Figure 1C:
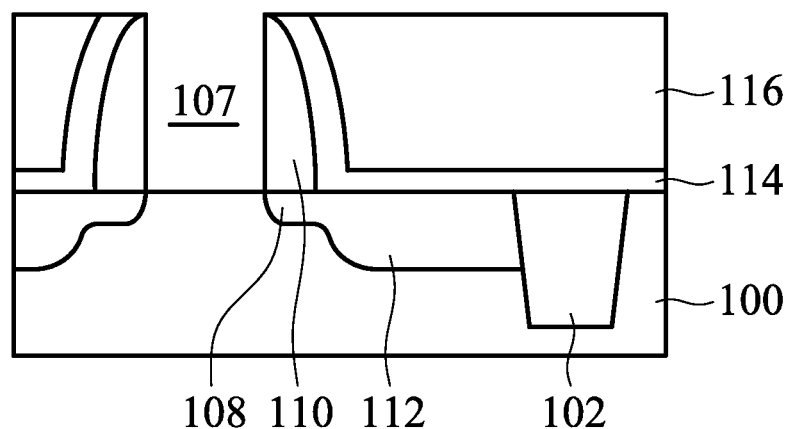

In some embodiments, the gate electrode 106 and the gate dielectric layer 104 are dummies and are meant to be replaced with a new metal gate electrode and a new gate dielectric layer, respectively. As shown in FIG. 1C, the gate electrode 106 and the gate dielectric layer 104 are removed to form a recess 107, in accordance with some embodiments. The recess 107 is between the spacer elements 110. One or more etching processes may be used to form the recess 107.

Figure 1D:
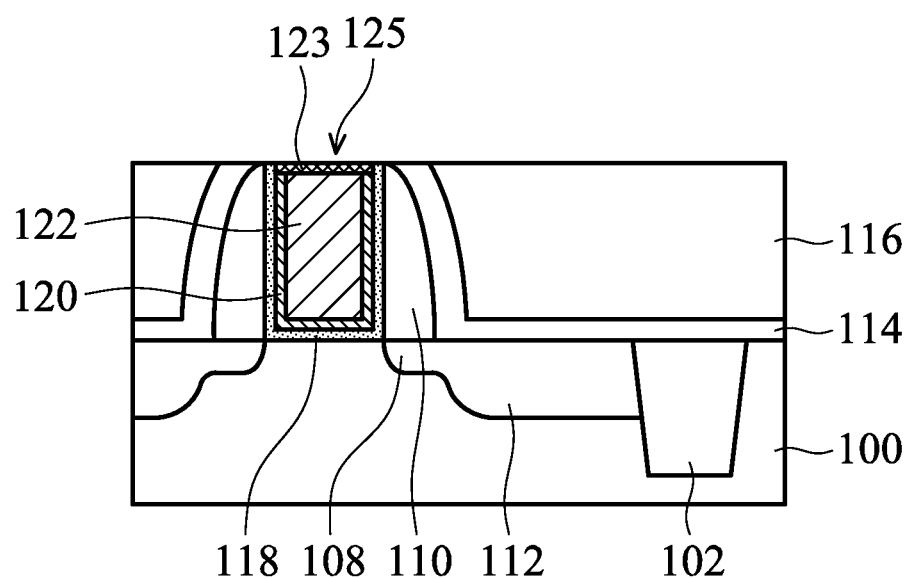

As shown in FIG. 1D, a metal gate stack 125 is formed in the recess 107, in accordance with some embodiments. In some embodiments, the metal gate stack 125 includes a gate dielectric layer 118, a work function layer 120, and a gate electrode layer 122. In some embodiments, the gate dielectric layer 118 is made of a high-k dielectric material. The high-k dielectric material may include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

The work function layer 120 is used to provide desired work function for transistors to enhance device performance, such as improved threshold voltage. In some embodiments, the work function layer 120 is an n-type metal layer capable of providing a work function value suitable for the device, such as equal to or less than about 4.5 eV. In some embodiments, the work function layer 120 is a p-type metal layer capable of providing a work function value suitable for the device, such as equal to or greater than about 4.8 eV.

The n-type metal layer may include metal, metal carbide, metal nitride, or a combination thereof. For example, the n-type metal layer includes titanium nitride, tantalum, tantalum nitride, other suitable materials, or a combination thereof. The p-type metal layer may include metal, metal carbide, metal nitride, other suitable materials, or a combination thereof. For example, the p-type metal includes tantalum nitride, tungsten nitride, titanium, titanium nitride, other suitable materials, or a combination thereof.

The work function layer 120 may also be made of hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combination thereof. The thickness and/or the compositions of the work function layer 120 may be tuned to adjust the work function level. For example, a titanium nitride layer may be used as a p-type metal layer or an n-type metal layer, depending on the thickness and/or the compositions of the titanium nitride layer.

In some embodiments, the gate electrode layer 122 is made of aluminum, tungsten, copper, another suitable material, or a combination thereof. The formation of the metal gate stack 125 may involve multiple deposition processes, planarization processes, and patterning processes. In some embodiments, a gate dielectric material layer, a work function material layer, and a gate electrode material layer are sequentially deposited over the structure shown in FIG. 1C to fill the recess 107. Afterwards, a planarization process is performed to remove portions of these layers outside of the recess 107. As a result, the remaining portions of these layers form the metal gate stack 125, as shown in FIG. 1D. The planarization process may include a CMP process, a grinding process, an etching process, another applicable process, or a combination thereof.

The planarization process may result in the formation of residues and/or defects on the exposed surfaces of the dielectric layer 116, the metal gate stack 125, and the contact etch stop layer 114. The residues may come from slurry used during the CMP process and/or the removed gate electrode layer 122, the work function layer 120, and the gate dielectric layer 118 formed outside of the recess 107. The residues may be inorganic residues, organic residues, metal-containing residues, and/or metal ion containing residues. The residues could have a negative impact in subsequent processes by creating defects, residual particles, and/or short-circuits. These defects may be physical defects or electrical defects and could trap carriers such as electrons. The trapped carriers may produce leakage current, which negatively affects the performance of the semiconductor device structure.

As shown in FIG. 1D, a metal oxide layer 123 is natively (spontaneously) grown on the exposed metal surface of the metal gate stack 125. As mentioned above, the metal gate stack 125 includes the gate dielectric layer 118, the work function layer 120, and the gate electrode layer 122. For example, the metal oxide layer 123 is naturally grown on the gate electrode layer 122 and the work function layer 120 when they are exposed to air. In some embodiments, the gate electrode layer 122 is an aluminum gate electrode, and the metal oxide layer 123 includes aluminum oxide. Some of the metal-containing residues may also be oxidized to form oxide residues after being exposed to air.

Due to the residues, the defects, and/or other compounds left on the exposed metal surface of the metal gate stack 125, the metal oxide layer 123 (native) has an unclean surface and poor quality. As a result, due to the unclean surface and the poor quality of the metal oxide layer 123, adhesion between the metal oxide layer 123 and a subsequently formed layer, such as an etch stop layer, is poor. The poor interfacial adhesion between the metal oxide layer 123 and the subsequently formed layer also negatively affects neighboring interface.

Etchants are used in subsequent contact formation and/or metal salicidation processes. The poor interfacial adhesion would allow etchants used in these operations to diffuse through the poor interface to come in contact with and damage the gate electrode layer 122 and/or the work function layer 120. The etchants could cause interfacial delamination. The gate electrode layer 122 and/or the work function layer 120 could be removed. Such delamination and loss of the gate electrode layer 122 and/or the work function layer 120 (i.e., metal missing) would reduce the yield.

Figure 1E:
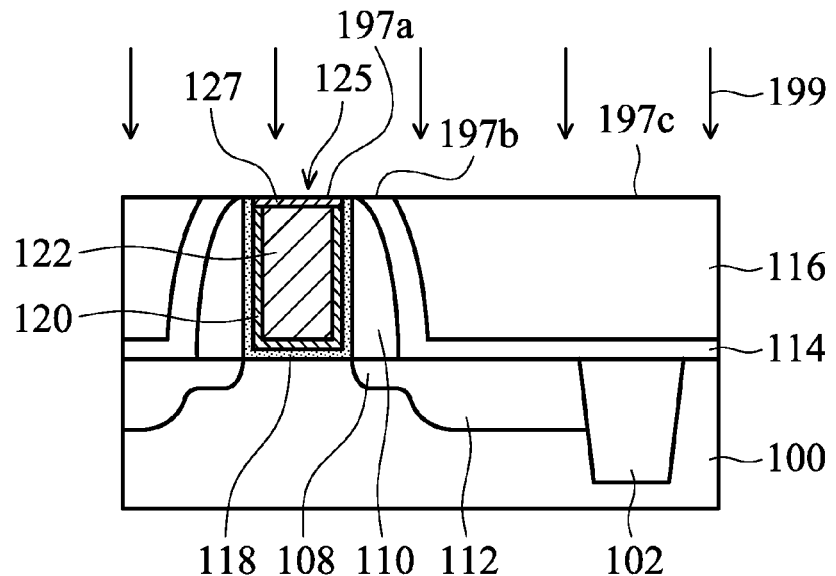

To solve the problems described above, a modification operation 199 is performed to modify the surfaces of the metal gate stack 125 and the dielectric layer 116, as shown in FIG. 1E in accordance with some embodiments. In some embodiments, the modification operation 199 involves a reduction operation. In some embodiments, the reduction operation is achieved by a hydrogen-involved treatment. In the modification operation 199, a hydrogen-containing reducing component is used to modify the surfaces of the metal gate stack 125, the dielectric layer 116, and the contact etch stop layer 114.

The hydrogen-containing reducing component could react with and chemically reduce (or deoxidize) the metal oxide layer 123 and/or be used to eliminate the oxide residues. In some embodiments, the metal oxide layer 123 is modified to form a modified layer 127, as shown in FIG. 1E. A portion of the metal oxide layer 123 may be chemically reduced and some of the oxide residues may be eliminated. The modified layer 127 has a modified surface 197a that is clean and high-quality.

In some embodiments, the modified surface 197a has a greater adhesion with a subsequently formed layer than the metal oxide layer 123. In some embodiments, the modified surface 197a further include hydrogen-containing functional groups, such as hydroxyl group or the like. Similarly, modified surfaces 197b and 197c of the contact etch stop layer 114 and the dielectric layer 116 are formed, as shown in FIG. 1E. The hydrogen-containing functional groups may contribute to the good adhesion between the modified surfaces 197a, 197b, and 197c and the subsequently formed layer, such as an etch stop layer.

Figure 2:
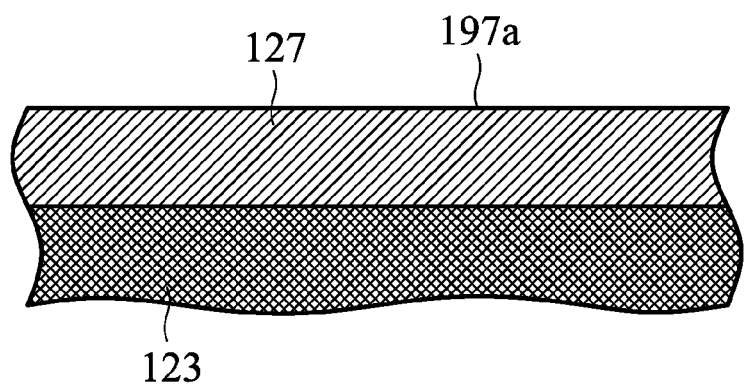
FIG. 2 is an enlarged cross-sectional view of a top portion of a metal gate stack, in accordance with some embodiments.

Many variations and/or modifications can be made to embodiments of the disclosure. In some other embodiments, only a surface portion of the metal oxide layer 123 is reduced to form the modified layer 127. The lower portion of the metal oxide layer 123 under the surface portion is not modified. FIG. 2 is an enlarged cross-sectional view of a top portion of the metal gate stack 125, in accordance with some embodiments. As shown in FIG. 2, a surface portion of the metal oxide layer 123 is reduced to form the modified layer 127 with the modified surface 197a. The lower portion of the metal oxide layer 123 remains without being modified or reduced. In some embodiments, an atomic concentration of hydrogen in the surface portion is greater than that in the lower portion of the metal oxide layer 123.

In some embodiments, the modification operation 199 is a hydrogen-containing plasma treatment, a hydrogen-containing solution treatment, a hydrogen-containing gas treatment, another suitable hydrogen-containing treatment, or a combination thereof.

In some embodiments, a hydrogen-containing gas is introduced into a process chamber where the structure shown in FIG. 1E is positioned. Afterwards, the hydrogen-containing gas is excited to generate hydrogen-containing plasma. The hydrogen-containing plasma is directed to react with the surfaces of the dielectric layer 116, the contact etch stop layer 114, and the metal gate stack 125. As a result, the surfaces of these layers are modified and/or chemically reduced to form the modified surfaces 197a, 197b, and 197c.

In some embodiments, the hydrogen-containing gas used for generating the hydrogen-containing plasma includes $NH_3$, $H_2$, $N_2H_2$, $H_2S$, $CH_4$, another suitable gas, or a combination thereof. In some embodiments, the hydrogen-containing gas is in a deuterated form. In some embodiments, two or more hydrogen-containing gases are used to generate the hydrogen-containing plasma.

In some embodiments, the hydrogen-containing plasma is formed from a flow of a gas mixture including a first hydrogen-containing gas and a second hydrogen-containing gas. In some embodiments, the first hydrogen-containing gas is also a nitrogen-containing gas. For example, the first hydrogen-containing gas includes ammonia gas ($NH_3$). In some embodiments, the second hydrogen-containing gas includes hydrogen gas ($H_2$). In some embodiments, the gas mixture further includes a carrier gas. For example, nitrogen gas is used as the carrier gas.

In some embodiments, the gas mixture has a volumetric concentration of the first hydrogen-containing gas that is controlled to be in a range from about 1% to about 3%. In some embodiments, the volumetric concentration of the second hydrogen-containing gas in the gas mixture is greater than that of the first hydrogen-containing gas. In some embodiments, the volumetric concentration of the second hydrogen-containing gas is in a range from about 65% to about 85%. In some embodiments, the volumetric concentration ratio of the first hydrogen-containing gas to the second hydrogen-containing gas is controlled to be in a range from about 0.02 to about 0.05.

In some cases, if the volumetric concentration ratio is less than about 0.02, the oxide layer 123 and/or some of the oxide residues may not be sufficiently reduced or eliminated. The oxide residues may negatively affect subsequent processes. For example, the oxide residues may inhibit the adhesion of a subsequently deposited layer, which may lead to a metal missing of the metal gate stack 125 during subsequent processes. In some cases, if the volumetric concentration ratio is greater than about 0.05, the hydrogen-containing plasma may cause a deposition of an undesired layer or an undesired material. The undesired layer or material may also negatively affect subsequent processes.

In some embodiments, the flow rate of the second hydrogen-containing gas is greater than that of the first hydrogen-containing gas. In some embodiments, the flow rate of first hydrogen-containing gas, such as ammonia gas ($NH_3$), is in a range from about 140 sccm to about 210 sccm. In some embodiments, the flow rate of second hydrogen-containing gas, such as hydrogen gas ($H_2$), is in a range from about 9000 sccm to about 11000 sccm. In some embodiments, the flow rate of the carrier gas, such as nitrogen gas, is in a range from about 3000 sccm to about 4000 sccm.

In some embodiments, RF power used in the hydrogen-containing plasma treatment is in a range from about 40 watts to about 60 watts. The RF power should not be too high to ensure no damage occurs to the metal gate stack 125 during the hydrogen-containing plasma treatment. The RF power should also not be too small to ensure an effective plasma generation. In some embodiments, the operation temperature of the hydrogen-containing plasma treatment is in a range from about 300 degrees C. to about 400 degrees C.

In some embodiments, the operation time of the hydrogen-containing plasma treatment should be carefully controlled. In some embodiments, the operation time of the hydrogen-containing plasma treatment is in a range from about 8 seconds to about 12 seconds.

In some cases, if the operation time is less than about 8 seconds, the oxide layer 123 and/or some of the oxide residues may not be sufficiently reduced or eliminated. The oxide residues may negatively affect subsequent processes. For example, the oxide residues may inhibit the adhesion of a subsequently deposited layer, which may lead to a metal missing of the metal gate stack 125 during subsequent processes.

In some cases, if the operation time is over about 12 seconds, the hydrogen-containing plasma treatment may cause the formation of an undesired material over the surface of the structure shown in FIG. 1E. The undesired layer or material may also inhibit the adhesion of a subsequently deposited layer, which may lead to a metal missing of the metal gate stack 125 during subsequent processes.

Many variations and modifications can be made to embodiments of the disclosure. In some other embodiments, the modification operation 199 is performed directly using a hydrogen-containing gas treatment. In these cases, the hydrogen-containing gas is not excited to generate plasma. In some embodiments, one or more hydrogen-containing gases are used to form the modified surfaces 197a, 197b, and 197c. For example, a gas mixture including hydrogen gas and nitrogen gas are used to form the modified surfaces 197a, 197b, and 197c.

Many variations and modifications can be made to embodiments of the disclosure. In some embodiments, the modification operation 199 is performed using a hydrogen-containing solution treatment. A hydrogen-containing reducing solution is applied on the structure shown in FIG. 1E to form the modified surfaces 197a, 197b, and 197c.

In some embodiments, the hydrogen-containing reducing solution is applied using a spray coating process, a dipping process, a spin-on process, another applicable process, or a combination thereof. In some embodiments, the hydrogen-containing reducing solution is provided during a CMP process. In some embodiments, the hydrogen-containing reducing solution is provided during a cleaning process performed after the CMP process.

Figure 1F:
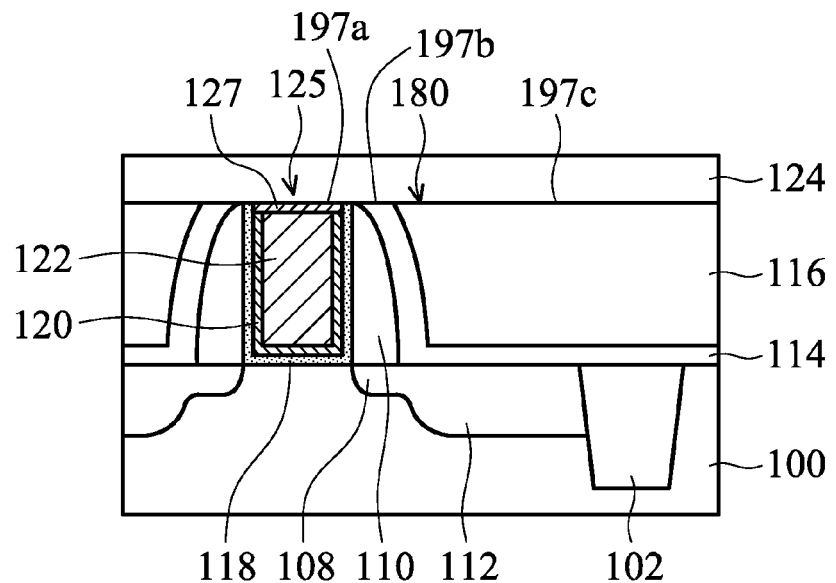

After the modification operation 199, an etch stop layer 124 is deposited over the modified surfaces 197a, 197b, and 197c, as shown in FIG. 1F in accordance with some embodiments. Because the modified surfaces 197a, 197b, and 197c are treated by the hydrogen-containing reducing component, the oxide residues and/or the metal oxide layer 123 mentioned above are now removed and/or at least partially reduced. Therefore, adhesion between the etch stop layer 124 and the modified layer 127, as well as the neighboring layers, is strong. The etch stop layer 124 formed is now in direct contact with a cleaner surface. The quality of the interface 180 between the etch stop layer 124 and the various underlying layers is significantly improved. In some embodiments, the interface 180 includes hydrogen. For example, the interface 180 includes hydrogen-containing functional groups, such as hydroxyl group or the like. In some other embodiments, the interface 180 further includes nitrogen. For example, the interface 180 further includes nitrogen-containing functional groups.

Figure 3:
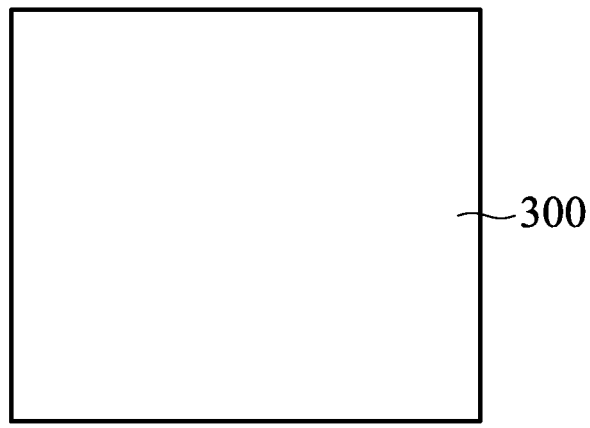
FIG. 3 is a cross-sectional view of a process chamber used for forming a semiconductor device structure, in accordance with some embodiments.

FIG. 3 is a cross-sectional view of a process chamber 300 used for forming a semiconductor device structure, in accordance with some embodiments. In some embodiments, the modification operation 199 is performed in the process chamber 300. In some embodiments, the etch stop layer 124 is deposited in-situ in the same process chamber 300 where the modification operation 199 is performed. The etch stop layer 124 is deposited right after the modification operation 199. Therefore, the modified layer 127 is not exposed to air and thus prevented from being oxidized and/or contaminated. The quality of the modified surface 197a may be maintained. The reliability of the semiconductor device structure is significantly improved.

Figure 1G:
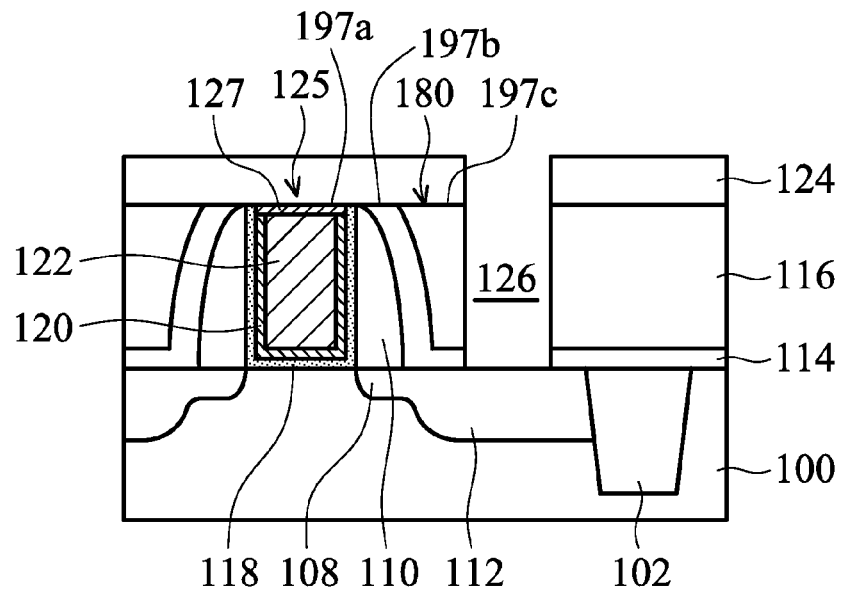

As shown in FIG. 1G, multiple etching processes are performed to form a contact opening 126 that exposes the doped region 112, in accordance with some embodiments. In some embodiments, the etch stop layer 124 is in direct contact with the modified surfaces 197a, 197b, and 197c. Therefore, due to the good adhesion between the etch stop layer 124 and the underlying layers, no interfacial delamination would occur. The strong interface 180 may prevent the etchants used for forming the contact opening 126 from diffusing through to contact with and damage the gate electrode layer 122. The gate electrode layer 122 is therefore prevented from being removed. Reliability of the semiconductor device structure is improved.

In some embodiments, the modification operation 199 is a hydrogen-containing plasma treatment. The hydrogen-containing plasma treatment includes exciting a gas mixture to generate a hydrogen-containing plasma. In some embodiments, the gas mixture includes ammonia gas. In some embodiments, an RF power used in the hydrogen-containing plasma treatment is in a range from about 40 W to about 60 W. A flow rate of the ammonia gas is in a range from about 140 sccm to about 210 sccm, and an operation time of the hydrogen-containing plasma treatment is in a range from about 8 seconds to about 12 seconds.

In some cases, if the operation time is less than about 8 seconds (such as 5 seconds), the number of broken metal gate stacks that can be detected in a wafer may be about three times of those with an operation time of about 10 seconds. In some cases, if the operation time is more than about 12 seconds (such as 20 seconds), the number of broken metal gate stacks that can be detected in a wafer may be about two times of those with an operation time of about 10 seconds. There may be multiple chemical reactions such as reduction reactions and/or oxidation reactions conducted during the hydrogen-containing plasma treatment. In some embodiments, when the operation time is maintained in a range from about 8 seconds to about 12 seconds, the performance and reliability of the final products are greatly improved.

Figure 1H:
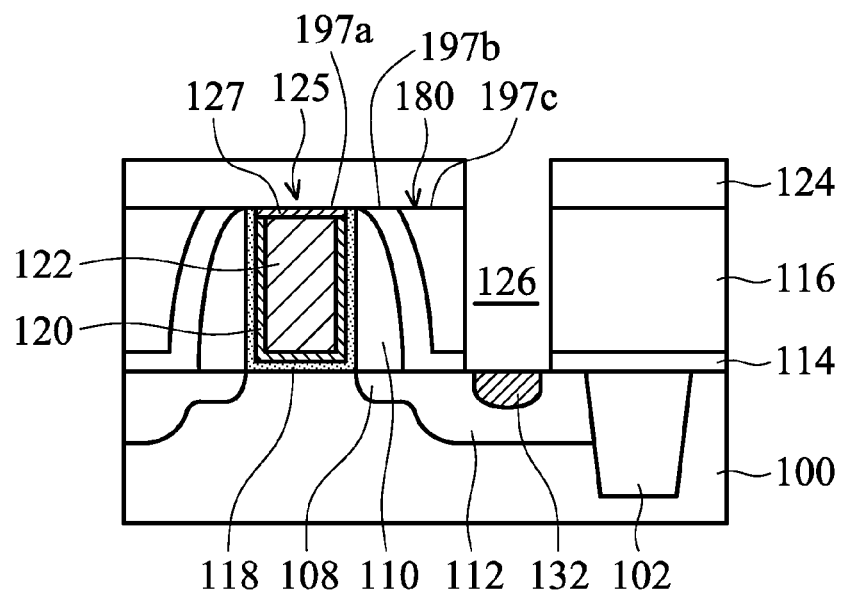

Afterwards, as shown in FIG. 1H, a salicidation (self-aligned silicidation) process is performed to form a metal silicide region 132 on/in the doped region 112, in accordance with some embodiments. The material of the metal silicide region 132 may include nickel silicide. In some embodiments, the metal silicide region 132 includes a silicide material of a suitable metal material. The suitable metal material may include cobalt (Co), nickel (Ni), platinum (Pt), titanium (Ti), ytterbium (Yb), molybdenum (Mo), erbium (Er), or a combination thereof.

During the salicidation process, an unreacted portion of a deposited metal film for forming the metal silicide region 132 is removed by using, for example, an etching process. The etching process may include a wet etching process, dry etching process, or a combination thereof. In some embodiments, a wet etching process is used to remove the unreacted metal film. An etchant, such as hot phosphoric acid, is chosen to remove the unreacted portion of the metal film.

In some embodiments, because the metal silicide region 132 is formed after the gate stack including the gate electrode layer 122, the quality of the metal silicide region 132 is not negatively affected by the annealing process for forming the gate stack, such as the annealing process of the gate dielectric layer 118. In other words, the metal silicide region 132 does not undergo too many annealing processes. The quality and reliability of the metal silicide region 132 is maintained.

Many variations and/or modifications can be made to embodiments of the disclosure. In some other embodiments, the salicidation process is not formed.

As shown in FIG. 1H, because the adhesion between the etch stop layer 124 and the modified layer 127 is good and the interface 180 is strong, an etchant capable of removing metal materials, such as that used during the salicidation process, may not be able to penetrate through the interface 180 to damage the gate electrode layer 122. Due to the modification operation 199, the metal gate stack 125 is protected.

Figure 1I:
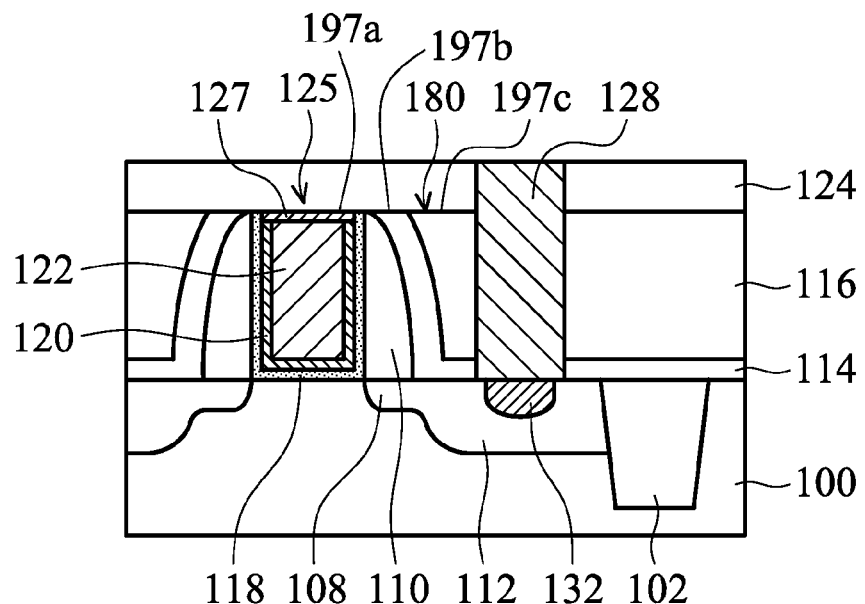

As shown in FIG. 1I, a conductive contact 128 is formed in the contact opening 126 to be in electrical contact with the metal silicide region 132, in accordance with some embodiments. In some embodiments, the conductive contact 128 is made of copper, aluminum, tungsten, titanium, cobalt, gold, platinum, another suitable material, or a combination thereof.

In some embodiments, a barrier layer (not shown) is formed over the sidewall of the contact opening 126 before the formation of the conductive contact 128. The barrier layer is used to protect the dielectric layer 116 from diffusion of a metal material from the conductive contact 128. In some embodiments, the barrier layer is made of titanium nitride, tantalum nitride, titanium, tungsten nitride, another suitable material, or a combination thereof.

In some embodiments, a barrier material layer is deposited over the bottom and sidewall of the contact opening 126. Afterwards, a conductive contact material is deposited over the barrier layer. Each of the barrier material layer and the conductive contact material layer may be deposited using a CVD process, a PVD process, an electroplating process, an electroless plating process, another applicable process, or a combination thereof. Afterwards, a planarization process is used to remove the portions of the barrier material layer and the conductive contact material layer outside of the contact opening 126. As a result, the conductive contact 128 is formed, as shown in FIG. 1I.

Figure 4:
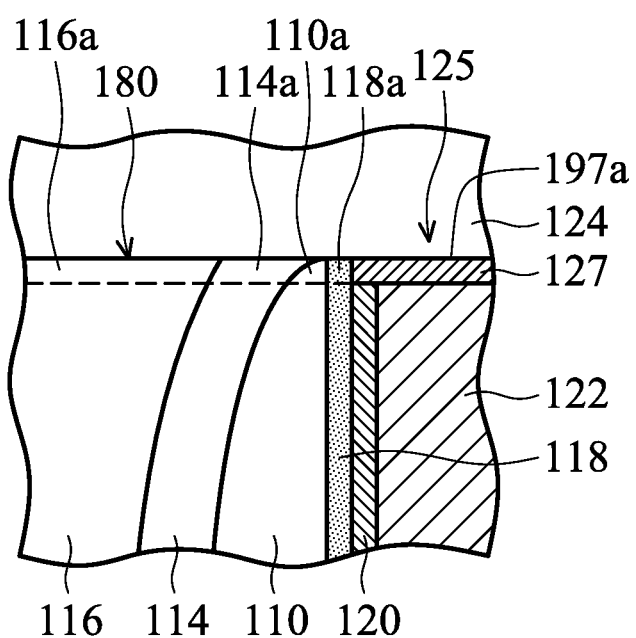
FIG. 4 is a cross-sectional view of a portion of a semiconductor device structure, in accordance with some embodiments.

FIG. 4 is a cross-sectional view of a portion of a semiconductor device structure, in accordance with some embodiments. In some embodiments, FIG. 4 is an enlarged cross-sectional view showing a portion of the structure shown in FIG. 1I. As shown in FIG. 4, the spacer element 110, the contact etch stop layer 114, and the dielectric layer 116 have upper portions 110a, 114a, and 116a, respectively. In some embodiments, due to the modification operation 199 (such as a hydrogen-containing plasma treatment), each or one of the upper portions 110a, 114a, and 116a has a greater atomic concentration of hydrogen than the lower portions away from the interface 180.

Embodiments of the disclosure use a modification operation to reduce a surface of a metal gate stack. The modification operation uses hydrogen-containing component, such as hydrogen-containing plasma, to modify the surface of the metal gate stack. Oxide materials such as native oxide or oxide residues are chemically reduced or eliminated by the hydrogen-containing reducing component to provide the metal gate stack a high quality surface. After the modification operation, adhesion between the metal gate stack and an etch stop layer formed on the metal gate stack is improved. Due to the good adhesion between the etch stop layer and the metal gate stack, the metal gate electrode of the metal gate stack is prevented from being damaged or removed during subsequent process steps. As a result, the process yield is greatly improved.

In accordance with some embodiments, a method for forming a semiconductor device structure is provided. The method includes forming a metal gate stack over a semiconductor substrate. The method also includes performing a hydrogen-containing plasma treatment on the metal gate stack to modify a surface of the metal gate stack. The hydrogen-containing plasma treatment includes exciting a gas mixture including a first hydrogen-containing gas and a second hydrogen-containing gas to generate a hydrogen-containing plasma.

In accordance with some embodiments, a method for forming a semiconductor device structure is provided. The method includes forming a metal gate stack over a semiconductor substrate. The method also includes performing a hydrogen-containing plasma treatment on the metal gate stack to form a modified surface of the metal gate stack. The hydrogen-containing plasma treatment includes exciting a gas mixture including ammonia gas to generate a hydrogen-containing plasma and an RF power used in the hydrogen-containing plasma treatment is in a range from about 40 watts to about 60 watts. A flow rate of the ammonia gas is in a range from about 140 sccm to about 210 sccm, and an operation time of the hydrogen-containing plasma treatment is in a range from about 8 seconds to about 12 seconds. The method further includes forming an etch stop layer directly on the modified surface.

In accordance with some embodiments, a method for forming a semiconductor device structure is provided. The method includes forming a metal gate stack over a semiconductor substrate. The method also includes performing a hydrogen-containing plasma treatment on the metal gate stack to chemically reduce a surface of the metal gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a metal gate stack over a semiconductor substrate; and
    performing a hydrogen-containing plasma treatment on the metal gate stack to modify a metal oxide layer formed on the metal gate stack, wherein the hydrogen-containing plasma treatment comprises exciting a gas mixture including a first hydrogen-containing gas and a second hydrogen-containing gas to generate a hydrogen-containing plasma, and a volumetric concentration ratio of the first hydrogen-containing gas to the second hydrogen-containing gas is in a range from about 0.02 to about 0.05.

2. The method for forming a semiconductor device structure as claimed in claim 1, wherein the gas mixture comprises $NH_3$, $H_2$, $N_2H_2$, $H_2S$, $CH_4$, or a combination thereof.

3. The method for forming a semiconductor device structure as claimed in claim 1, wherein the first hydrogen-containing gas is ammonia gas, and the second hydrogen-containing gas is hydrogen gas.

4. The method for forming a semiconductor device structure as claimed in claim 3, wherein an RF power used in the hydrogen-containing plasma treatment is in a range from about 40 watts to about 60 watts.

5. The method for forming a semiconductor device structure as claimed in claim 4, wherein a flow rate of the first hydrogen-containing gas is in a range from about 140 sccm to about 210 sccm.

6. The method for forming a semiconductor device structure as claimed in claim 5, wherein an operation time of the hydrogen-containing plasma treatment is in a range from about 8 seconds to about 12 seconds.

7. The method for forming a semiconductor device structure as claimed in claim 6, wherein an operation temperature of the hydrogen-containing plasma treatment is in a range from about 300 degrees C. to about 400 degrees C.

8. The method for forming a semiconductor device structure as claimed in claim 1, further comprising forming an etch stop layer over the metal gate stack after the hydrogen-containing plasma treatment.

9. The method for forming a semiconductor device structure as claimed in claim 8, wherein the etch stop layer is formed in-situ in a process chamber where the hydrogen-containing plasma treatment is performed.

10. The method for forming a semiconductor device structure as claimed in claim 1, further comprising:
    forming a dummy gate stack over a semiconductor substrate;
    forming a dielectric layer to surround the dummy gate stack;
    removing the dummy gate stack to form a recess in the dielectric layer, wherein the metal gate stack is formed in the recess after the removal of the dummy gate stack;
    forming a second dielectric layer directly on the dielectric layer and the metal gate stack after the hydrogen-containing plasma treatment; and
    forming a conductive contact penetrating through the second dielectric layer and the dielectric layer such that the conductive contact is electrically connected to a source/drain region at least partially formed in the semiconductor substrate.

11. The method for forming a semiconductor device structure as claimed in claim 10, further comprising forming a metal silicide region on the source/drain region after the hydrogen-containing plasma treatment and before the formation of the conductive contact.

12. The method for forming a semiconductor device structure as claimed in claim 1, wherein the metal oxide layer has a lower portion and an upper portion, and the upper portion of the metal oxide layer is reduced to form a modified layer by the hydrogen-containing plasma treatment.

13. The method for forming a semiconductor device structure as claimed in claim 12, wherein an atomic concentration of hydrogen in the modified layer is greater than an atomic concentration of hydrogen in the lower portion of the metal oxide layer.

14. A method for forming a semiconductor device structure, comprising:
    forming a metal gate stack over a semiconductor substrate;
    performing a hydrogen-containing plasma treatment on the metal gate stack to form a modified surface of the metal gate stack, wherein the hydrogen-containing plasma treatment comprises exciting a gas mixture including ammonia gas and a second hydrogen-containing gas to generate a hydrogen-containing plasma, a volumetric concentration ratio of the ammonia gas to the second hydrogen-containing gas is in a range from about 0.02 to about 0.05, an RF power used in the hydrogen-containing plasma treatment is in a range from about 40 watts to about 60 watts, a flow rate of the ammonia gas is in a range from about 140 sccm to about 210 sccm, and an operation time of the hydrogen-containing plasma treatment is in a range from about 8 seconds to about 12 seconds; and forming an etch stop layer directly on the modified surface.

15. The method for forming a semiconductor device structure as claimed in claim 14, wherein the gas mixture further comprises $H_2$, $N_2H_2$, $H_2S$, $CH_4$, or a combination thereof.

16. The method for forming a semiconductor device structure as claimed in claim 14, wherein the etch stop layer is formed in-situ in a process chamber where the hydrogen-containing plasma treatment is performed.

17. A method for forming a semiconductor device structure, comprising:

forming a dummy gate stack over a semiconductor substrate;

forming a dielectric layer to surround the dummy gate stack;

replacing the dummy gate stack with a metal gate stack after the formation of the dielectric layer;

performing a hydrogen-containing plasma treatment on the metal gate stack to chemically reduce a surface of the metal gate stack, wherein the hydrogen-containing plasma treatment comprises exciting a gas mixture including a first hydrogen-containing gas and a second hydrogen-containing gas to generate a hydrogen-containing plasma, and a volumetric concentration ratio of the first hydrogen-containing gas to the second hydrogen-containing gas is in a range from about 0.02 to about 0.05;

forming a second dielectric layer directly on the dielectric layer and the metal gate stack after the hydrogen-containing plasma treatment;

partially etching the second dielectric layer and the dielectric layer to form a contact opening such that the contact opening exposes a doped region formed in the semiconductor substrate; and forming a conductive contact in the contact opening.

18. The method for forming a semiconductor device structure as claimed in claim 17, wherein the first hydrogen-containing gas is ammonia gas, and the second hydrogen-containing gas is hydrogen gas.

19. The method for forming a semiconductor device structure as claimed in claim 18, wherein an RF power used in the hydrogen-containing plasma treatment is in a range from about 40 watts to about 60 watts, a flow rate of the ammonia gas is in a range from about 140 sccm to about 210 sccm, and an operation time of the hydrogen-containing plasma treatment is in a range from about 8 seconds to about 12 seconds.

20. The method for forming a semiconductor device structure as claimed in claim 17, wherein a volumetric concentration of the first hydrogen-containing gas in the gas mixture is in a range from about 1% to about 3%, and a volumetric concentration of the second hydrogen-containing gas in the gas mixture is in a range from about 65% to about 85%.

* * * * *